United States Patent [19]
Atriss et al.

[11] Patent Number: 5,285,114
[45] Date of Patent: Feb. 8, 1994

[54] PHASE LOCK LOOP CHARGE PUMP WITH SYMMETRICAL CHARGE AND DISCHARGE CURRENTS

[75] Inventors: Ahmad H. Atriss, Chandler; Benjamin C. Peterson, Tempe, both, Ariz.

[73] Assignee: Codex Corp., Mansfield, Mass.

[21] Appl. No.: 930,943

[22] Filed: Aug. 17, 1992

[51] Int. Cl.$^5$ .................... H03K 17/687; H03K 5/13
[52] U.S. Cl. .................. 307/264; 307/578; 307/607; 328/155; 331/17
[58] Field of Search ............ 307/578, 607, 264; 328/155; 331/17

[56] References Cited

U.S. PATENT DOCUMENTS 4,910,713  3/1990  Madden et al. .................. 307/530

*Primary Examiner*—Margaret R. Wambach
*Attorney, Agent, or Firm*—Robert D. Atkins

[57] ABSTRACT

A charge pump in a phase lock loop equalizes the charge and discharge currents flowing into the filter capacitor independent of the loop node voltage for providing a linear VCO output frequency. The potential at the output of the charge pump determines whether the charging/discharging current is decreased or increased. An active up control signal to increase VCO output frequency and a low level potential at the output of the charge pump limits the charging current to the loop filter while increasing the discharge current. An active down control signal to decrease the VCO output frequency and a high potential at the output of the charge pump limits the discharging current while increasing the charge current. The voltage change at the output of the charge pump in response to the up control signal is made equal to the voltage change during the down control signal for providing equal charge and discharge currents to the loop filter independent of the loop voltage.

8 Claims, 2 Drawing Sheets

PHASE LOCK LOOP CHARGE PUMP WITH SYMMETRICAL CHARGE AND DISCHARGE CURRENTS

BACKGROUND OF THE INVENTION

The present invention relates in general to charge pumps and, more particularly, to a charge pump in a phase lock loop.

A conventional phase lock loop (PLL) generally includes a phase detector for monitoring a phase difference between an input signal and an output signal of a voltage controlled oscillator (VCO). The phase detector generates an up control signal and a down control signal for a charge pump to charge and discharge a loop filter at the input of the VCO. The loop voltage developed across the loop filter determines the output frequency of the VCO. The up and down control signals drive the VCO to maintain a predetermined phase relationship between the signals applied to the phase detector, as is well understood.

The charge pump of the prior art PLL may include a p-channel charging transistor and an n-channel discharging transistor serially coupled between a positive power supply conductor (5.0 volts) and ground potential. A resistor, say 60K ohms, is connected between the interconnection of the drains of the p-channel and n-channel transistors and the loop filter for sourcing and sinking current thereto. The current flowing through the charging transistors is proportional to their drain-source potential ($V_{DS}$), according to a well known relationship. Unfortunately, the current from the charging transistors becomes non-symmetrical when the loop voltage is less than about 1.6 or greater than 3.0 volts. For example, if the charge pump receives an up control signal to charge the loop filter and the loop voltage is driving the VCO with, say 1.0 volt, the $V_{DS}$ of the p-channel transistor is 5.0−1.0=4.0 volts. Alternatively, if the charge pump receives a down control signal to discharge the loop filter while the loop voltage is 1.0 volt, the $V_{DS}$ of the n-channel transistor is 1.0−0.0=1.0 volt. The difference in $V_{DS}$ of the p-channel and n-channel transistors given the same loop voltage causes non-symmetrical charging and discharging currents.

A similar problem occurs with the up and down control signals when the loop voltage is operating at a high voltage. In this case, the $V_{DS}$ of the n-channel transistor is greater than the $V_{DS}$ of the p-channel transistor given the same loop voltage. Again, the non-symmetrical charging current as a function of the up and down control signals and loop voltage tends to produce a non-linear change in loop voltage. Thus, while the frequency versus loop voltage is approximately linear between say 1.6 volts and 3.0 volts, it becomes non-linear between 0.0 to 1.6 volts and between 3.0 and 5.0 volts. The non-symmetrical charging current from the charge pump makes achieving phase lock more difficult in PLLs.

Hence, a need exists for a charge pump in a PLL for providing a linear charging current to the loop filter independent of loop voltage.

DETAILED DESCRIPTION OF THE PREFERRED EMBODIMENT

Figure 1:
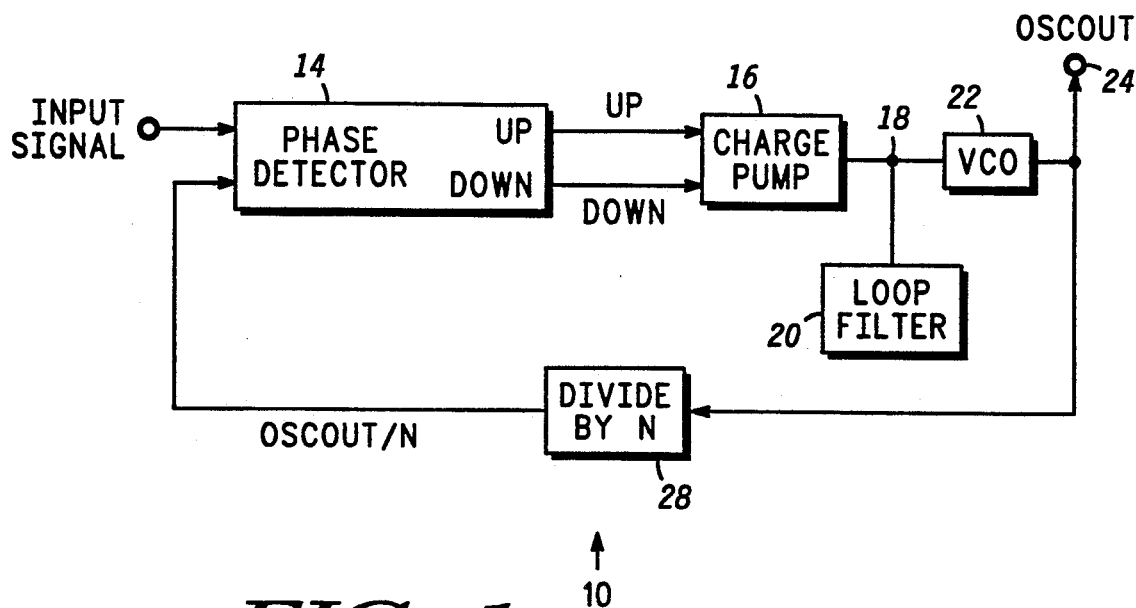
FIG. 1 is a block diagram illustrating a PLL.

A phase lock loop (PLL) 10 is shown in FIG. 1 suitable for manufacturing as an integrated circuit using conventional integrated circuit processes. An input signal is applied at a first input of phase detector 14 which generates an UP control signal and a DOWN control signal for charge pump 16. The output of charge pump 16 drives loop node 18 for charging and discharging loop filter 20 which may comprise a capacitor coupled between loop node 18 and ground potential. The loop voltage at loop node 18 controls voltage controlled oscillator (VCO) 22 for generating an oscillator signal OSCOUT at output 24. The oscillator signal of VCO 22 is divided through divide-by-N circuit 28 (N=16) for providing an OSCOUT/N signal as applied at a second input of phase detector 14.

An UP control signal increases the loop voltage to increase the output frequency of VCO 22 while a DOWN control signal reduces the loop voltage to decrease the output frequency of VCO 22. The mutually exclusive UP and DOWN control signals drive VCO 22 to maintain a predetermined phase relationship between the signals applied at the first and second inputs of phase detector 14. The pulse width of the UP and DOWN control signals determines the amount of charge transferred to the loop filter. The greater the phase difference between the input signal and the OSCOUT/N signal, the greater the pulse width of the UP or DOWN control signal to drive the loop toward the predetermined phase relationship.

Figure 2:
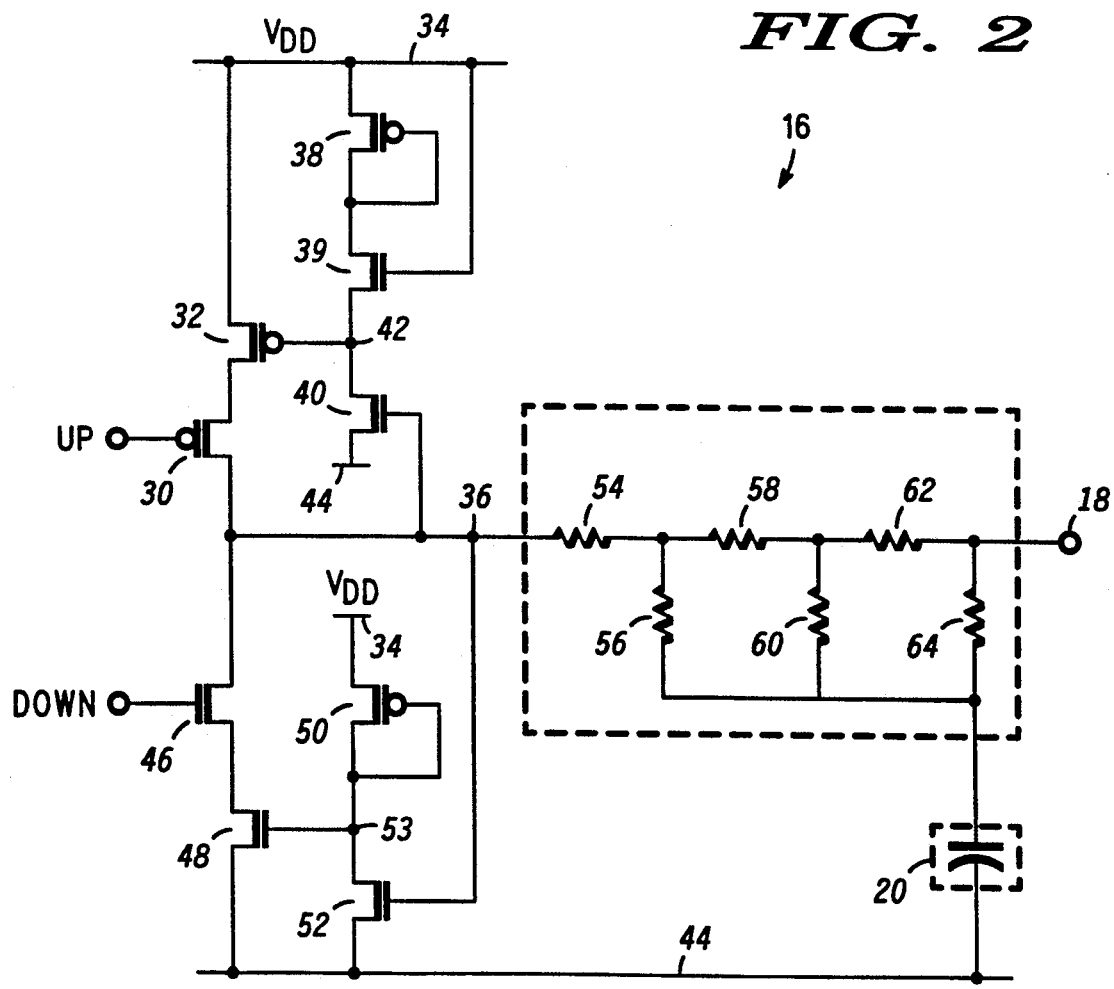
FIG. 2 is a schematic diagram illustrating the charge pump of FIG. 1.

Turning to FIG. 2, charge pump 16 is shown in further detail including transistor 30 having a gate receiving the UP control signal from phase detector 14. The source of transistor 30 is coupled through transistor 32 to power supply conductor 34 operating at a positive power supply potential $V_{DD}$ (5.0 volts). The drain of transistor 30 is coupled to node 36. Transistor 38 is configured as a diode between power supply conductor 34 and the drain of transistor 39. The gate of transistor 39 is coupled to power supply conductor 34, and the source of transistor 39 is coupled to the drain of transistor 40 and to the gate of transistor 32 at node 42. Transistor 40 also includes a gate coupled to node 36 and a source coupled to power supply conductor 44 operating at ground potential.

Charge pump 16 further includes transistor 46 having a gate receiving the DOWN control signal from phase detector 14. The source of transistor 46 is coupled through transistor 48 to power supply conductor 44, and the drain of transistor 46 is coupled to node 36. Transistor 50 is configured as a diode between power supply conductor 34 and the drain of transistor 52 at node 53. The gate of transistor 48 is also coupled to the drain of transistor 52 which includes a gate coupled to node 36 and a source coupled to power supply conductor 44. The transient voltage developed at node 36 is filtered by resistor network 54–64 and loop filter capacitor 20 to prevent overshooting at loop node 18. Resistors 54, 58 and 62 may be selected at 1800 ohms each while resistors 56, 60 and 64 are selected at 360 ohms. In steady-state operation with minimal charging current flowing, the voltage at node 36 is substantially equal to the loop voltage at node 18.

Figure 3:
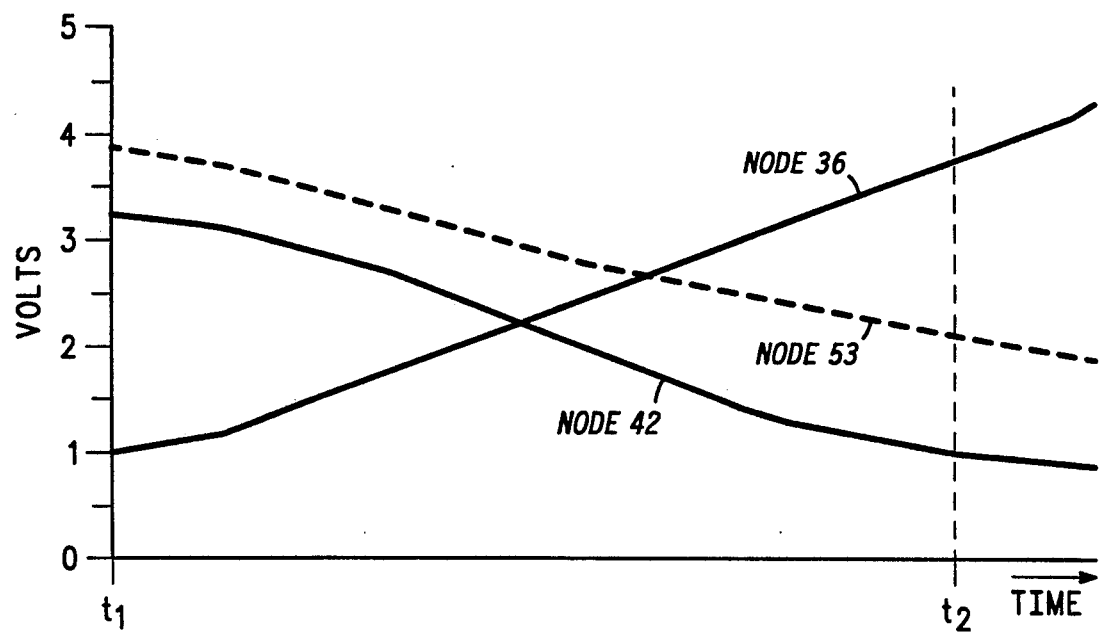
FIG. 3 is a waveform plot useful in the explanation of the present invention.

Assume loop node 18 is operating at a lower potential, say 1.0 volt as shown in FIG. 3 at time t₁, and the UP control signal is active (logic zero pulse) to increase the voltage at loop node 18 and drive VCO 22 toward an increasing output frequency. A low potential at node 36 creates the need for a weaker charging current and stronger discharging current because of the inherent non-symmetry in current flow due to differences in $V_{DS}$ of transistors 30 and 46 depending on loop node voltage, as noted in the background. Accordingly, the lower potential at node 36 reduces the conduction through transistor 40 to establish a voltage of say 3.2 volts at node 42, thereby decreasing the $V_{GS}$ and current flow through transistor 32. A two nanosecond UP control signal enables transistor 30 to charge node 36 and increase its voltage by say ΔV1 (10 millivolts). However, the higher potential at node 42 limits the current flow through transistor 32 and therefore the charging current through transistor 30 and resistor network 54-64 into filter capacitor 20. Transistor 39 maintains transistor 32 at least at a minimum conduction threshold even for a minimum voltage at node 36. Transistors 32 and 48 continue at least a minimum state of conduction at all times.

The same lower potential at node 36 also reduces the current flow through transistor 52 and establishes a higher voltage at node 53 of say 3.8 volts, see FIG. 3. Transistor 48 turns on harder with a greater $V_{GS}$ such that a two nanosecond enabling DOWN signal (logic one pulse) from phase detector 14 conducts a larger discharging current from node 36. The voltage at node 36 decreases by say ΔV2 during the DOWN signal.

Thus, the present invention limits the current flow through resistor network 54-64 and filter capacitor 20 during an UP control signal by sensing the low voltage at node 36 with transistor 40 and reducing the conduction through transistor 32. The ΔV1 pulse at node 36 during an active UP control signal is thus current limited. Similarly, transistor 52 senses the low steady-state voltage at node 36 and increases the discharge current through transistors 46 and 48 during the DOWN control signal. The ΔV1 pulse during the UP control signal should be made approximately equal to the ΔV2 pulse during the DOWN control signal for providing equal charge and discharge currents to the loop filter independent of the loop voltage.

Now consider loop node 18 operating at a high potential, say 4.0 volts as shown in FIG. 3 at time t₂. In this case, the higher potential at node 36 creates the need for a stronger charging current and weaker discharging current. When the UP control signal is active, the higher potential at node 36 turns on transistor 40 harder, thereby decreasing the voltage at node 42 and increasing the current flow through transistor 32. A two nanosecond UP control signal enables transistor 30 to conduct and charge node 36 by ΔV1 (10 millivolts). The higher potential at node 42 increases the current flow through transistor 32 and the charging current through transistor 30 and resistor network 54-64 into filter capacitor 20. The same high potential at node 36 also increases the current flow through transistor 52 and decreases the voltage at node 53, see FIG. 3. Transistor 48 conducts less current such that a two nanosecond DOWN signal from phase detector 14 conducts a smaller discharge current from node 36.

Again, the present invention maintains equal charge and discharge currents through resistor network 54-64 and filter capacitor 20 by increasing the charge current during the UP control signal by sensing a high voltage at node 36 and increasing the conduction of transistor 32. Similarly, transistor 52 senses the high steady-state voltage at node 36 and decreases the discharge current through transistors 46 and 48 during the DOWN control signal. The ΔV2 pulse at node 36 during an active DOWN control signal is thus current limited. The ΔV1 pulse during the UP control signal is made equal to the ΔV2 pulse during the DOWN control signal.

By sizing transistors 30-52 appropriately, the charging current may be made equal to the discharging current independent of the steady-state loop node voltage. The following table illustrates possible transistor dimensions:

| Transistor | Gate width/length (microns) |
| --- | --- |
| 30 | 24/8 |
| 32 | 48/8 |
| 38 | 28/8 |
| 39 | 12/8 |
| 40 | 10/8 |
| 46 | 8/24 |
| 48 | 12/8 |
| 50 | 36/8 |
| 52 | 16/8 |

For medium range steady-state voltages at loop node 18, transistor 40 and 52 maintain the proper voltages at nodes 42 and 53, respectively, to control transistors 32 and 48 such that the charging current during an UP control signal is equal to the discharging current during a DOWN control signal independent of loop node voltage. The ΔV1 pulse (30 millivolts) during the UP control signal is made approximately equal to the ΔV2 pulse during the DOWN control signal. Thus, the loop node voltage changes linearly over its entire range and the output frequency of VCO 22 remains linearly over the range of loop node voltages. The symmetrical charging currents from charge pump 16 is advantageous for PLL 10 in readily achieving phase lock.

While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention.

What is claimed is:

1. A circuit, comprising:

a first transistor having a gate, a drain and a source, said gate receiving a first control signal, said drain being coupled to an output of circuit;

a second transistor having a gate, a drain and a source, said source being coupled to a first power supply conductor, said drain being coupled to said source of said first transistor;

a third transistor having a gate, a drain and a source, said gate being coupled to said output of the circuit, said drain being coupled to said first power supply conductor and to said gate of said second transistor, said source being coupled to a second power supply conductor;

a fourth transistor having a gate, a drain and a source, said source being coupled to said drain of said third transistor, said gate being coupled to said first power supply conductor; and a fifth transistor having a gate, a drain and a source, said gate and drain being coupled together to said drain of said fourth transistor, said source being coupled to said first power supply conductor.

2. The circuit of claim 1 further including:
a sixth transistor having a gate, a drain and a source, said gate receiving a second control signal, said drain being coupled to said output of the circuit;
a seventh transistor having a gate, a drain and a source, said source being coupled to said second power supply conductor, said drain being coupled to said source of said sixth transistor; and
an eighth transistor having a gate, a drain and a source, said gate being coupled to said output of the circuit, said drain being coupled to said first power supply conductor and to said gate of said seventh transistor, said source being coupled to said second power supply conductor.

3. The circuit of claim 2 further including a ninth transistor having a gate, a drain and a source, said gate and drain being coupled together to said drain of said eighth transistor, said source being coupled to said first power supply conductor.

4. A method of equalizing charge and discharge currents through a charge pump, comprising the steps of:
activating a first control signal to source the charge current into an output of the charge pump;
activating a second control signal to sink the discharge current from said output of the charge pump;
sensing a potential at said output of the charge pump; and
limiting current flowing into said output of the charge pump upon activating said first control signal and upon sensing said potential at said output of the charge pump at a low level;

5. The method of claim 4 further including the steps of:
limiting the discharge current flowing from said output of the charge pump upon activating said second control signal and sensing said potential at said output of the charge pump at a high level.

6. An integrated charge pump circuit, comprising:

a first transistor having a gate, a drain and a source, said gate receiving a first control signal, said drain being coupled to an output of the charge pump;
a second transistor having a gate, a drain and a source, said source being coupled to a first power supply conductor, said drain being coupled to said source of said first transistor;
a third transistor having a gate, a drain and a source, said gate being coupled to said output of the charge pump, said drain being coupled to said first power supply conductor and to said gate of said second transistor, said source being coupled to a second power supply conductor;
a fourth transistor having a gate, a drain and a source, said gate receiving a second control signal, said drain being coupled to said output of the charge pump;
a fifth transistor having a gate, a drain and a source, said source being coupled to said second power supply conductor, said drain being coupled to said source of said fourth transistor; and
a sixth transistor having a gate, a drain and a source, said gate being coupled to said output of the charge pump, said drain being coupled to said first power supply conductor and to said gate of said fifth transistor, said source being coupled to said second power supply conductor.

7. The charge pump of claim 6 further including:
a seventh transistor having a gate, a drain and a source, said source being coupled to said drain of said third transistor, said gate being coupled to said first power supply conductor; and
an eighth transistor having a gate, a drain and a source, said gate and drain being coupled together to said drain of said seventh transistor, said source being coupled to said first power supply conductor.

8. The charge pump of claim 7 further including a ninth transistor having a gate, a drain and a source, said gate and drain being coupled together to said drain of said sixth transistor, said source being coupled to said first power supply conductor.

* * * * *

UNITED STATES PATENT AND TRADEMARK OFFICE
CERTIFICATE OF CORRECTION

PATENT NO. : 5,285,114

DATED : February 8, 1994

INVENTOR(S) : Ahmad H. Atriss and Benjamin C. Peterson

It is certified that error appears in the above-indentified patent and that said Letters Patent is hereby corrected as shown below:

In column 4, line 52, claim 1, delete the words "of circuit" and insert therefor --of the circuit--.
In column 5, line 33, claim 4, delete the words "limiting current" and insert therefor --limiting the charge current--.
In column 5, line 36, claim 4, delete ";" and insert therefor --.--.
In column 5, line 41, claim 5, delete the words "and sensing" and insert therefor --and upon sensing--.

Signed and Sealed this

Twenty-sixth Day of July, 1994

Attest:

BRUCE LEHMAN

*Attesting Officer*      *Commissioner of Patents and Trademarks*